(12) United States Patent
Saeki

(10) Patent No.: US 9,099,341 B2
(45) Date of Patent: Aug. 4, 2015

(54) FIELD EFFECT TRANSISTOR

(71) Applicant: MURATA MANUFACTURING CO., LTD., Kyoto (JP)

(72) Inventor: Hiromasa Saeki, Kyoto (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 0 days.

(21) Appl. No.: 14/162,681

(22) Filed: Jan. 23, 2014

(65) Prior Publication Data

US 2014/0138743 A1 May 22, 2014

Related U.S. Application Data

(63) Continuation of application No. PCT/JP2012/068669, filed on Jul. 24, 2012.

(30) Foreign Application Priority Data

Aug. 1, 2011 (JP) .................................. 2011-168515

(51) Int. Cl.
*H01L 29/66* (2006.01)
*H01L 29/10* (2006.01)
(Continued)

(52) U.S. Cl.
CPC .......... *H01L 29/105* (2013.01); *H01L 29/4236* (2013.01); *H01L 29/66462* (2013.01); *H01L 29/7783* (2013.01); *H01L 29/7787* (2013.01); *H01L 29/2003* (2013.01)

(58) Field of Classification Search
CPC ...................... H01L 21/02381; H01L 21/0254; H01L 33/007; H01L 29/66636; H01L 29/778; H01L 29/812; H01L 29/78

USPC ........................................... 257/192, 190, 194
See application file for complete search history.

(56) References Cited

U.S. PATENT DOCUMENTS 4,737,827 A * 4/1988 Ohta .............................. 257/192
5,326,995 A * 7/1994 Ohori ............................ 257/194
(Continued)

FOREIGN PATENT DOCUMENTS

JP      S55-1122 A     1/1980
JP      2000-164852 A  6/2000
(Continued)

OTHER PUBLICATIONS

International Search Report; PCT/JP2012/068669; Oct. 16, 2012.
(Continued)

*Primary Examiner* — Jarrett Stark
(74) *Attorney, Agent, or Firm* — Studebaker & Brackett PC

(57) ABSTRACT

The following layers are deposited above the upper surface of a base substrate in this order with a lattice relaxation layer therebetween: a lower barrier layer made of $Al_xGa_{1-x}N$ ($0<x\leq0.20$), a channel layer made of GaN, and an upper barrier layer made of $Al_yGa_{1-y}N$ ($0.15\leq y\leq0.30$, where $x<y$). A drain electrode, a source electrode, and an insulating layer are placed on the upper surface of the upper barrier layer. Furthermore, a gate electrode is placed in a position spaced with the insulating layer. A recessed structure is placed directly under the gate electrode. The channel layer includes an n-type doped second channel sub-layer and undoped first channel sub-layer deposited on the lower barrier layer in that order. The bottom of the recessed structure is within the heightwise range of the first channel sub-layer.

5 Claims, 5 Drawing Sheets

(51) Int. Cl.
*H01L 29/423* (2006.01)
*H01L 29/778* (2006.01)
*H01L 29/20* (2006.01)

(56) References Cited

U.S. PATENT DOCUMENTS

| | | | |
|---|---|---|---|
| 6,479,843 B2* | 11/2002 | Huang et al. | 257/192 |
| 6,624,452 B2* | 9/2003 | Yu et al. | 257/194 |
| 6,888,170 B2* | 5/2005 | Schaff et al. | 257/98 |
| 7,038,253 B2* | 5/2006 | Yoshida et al. | 257/192 |
| 7,326,971 B2* | 2/2008 | Harris et al. | 257/194 |
| 7,429,534 B2* | 9/2008 | Gaska et al. | 438/705 |
| 7,838,904 B2* | 11/2010 | Nakazawa et al. | 257/194 |
| 7,943,496 B2 | 5/2011 | Nomura et al. | |
| 8,304,811 B2* | 11/2012 | Zhang | 257/194 |
| 8,487,384 B2* | 7/2013 | Nakamura et al. | 257/411 |
| 8,525,227 B2* | 9/2013 | Jeon et al. | 257/192 |
| 8,633,519 B2* | 1/2014 | Oka | 257/201 |
| 8,674,407 B2* | 3/2014 | Ando et al. | 257/194 |
| 8,803,246 B2* | 8/2014 | Wu et al. | 257/392 |
| 8,853,709 B2* | 10/2014 | Chu et al. | 257/77 |
| 8,860,089 B2* | 10/2014 | Park et al. | 257/194 |
| 2003/0116774 A1* | 6/2003 | Yamamoto et al. | 257/94 |
| 2004/0051104 A1 | 3/2004 | Yamashita et al. | |
| 2004/0245917 A1* | 12/2004 | Lu et al. | 313/503 |
| 2005/0067693 A1* | 3/2005 | Nihei et al. | 257/720 |
| 2005/0077541 A1* | 4/2005 | Shen et al. | 257/194 |
| 2005/0087751 A1* | 4/2005 | Nakamura et al. | 257/94 |
| 2005/0145883 A1* | 7/2005 | Beach et al. | 257/194 |
| 2008/0237605 A1* | 10/2008 | Murata et al. | 257/76 |
| 2010/0184262 A1* | 7/2010 | Smorchkova et al. | 438/172 |
| 2010/0210080 A1* | 8/2010 | Nomura et al. | 438/197 |
| 2011/0006346 A1 | 1/2011 | Ando et al. | |
| 2011/0018040 A1* | 1/2011 | Smith et al. | 257/288 |
| 2011/0049526 A1* | 3/2011 | Chu et al. | 257/76 |
| 2011/0073910 A1* | 3/2011 | Takizawa et al. | 257/192 |
| 2011/0140121 A1* | 6/2011 | Lee et al. | 257/76 |
| 2011/0241088 A1* | 10/2011 | Sato et al. | 257/288 |
| 2011/0278540 A1* | 11/2011 | Tanaka et al. | 257/20 |
| 2012/0146097 A1* | 6/2012 | Endo et al. | 257/194 |
| 2013/0099286 A1* | 4/2013 | Imada | 257/194 |
| 2013/0105817 A1* | 5/2013 | Saunier | 257/77 |
| 2013/0105862 A1* | 5/2013 | Kanamura et al. | 257/192 |
| 2013/0256693 A1* | 10/2013 | Nakamura et al. | 257/76 |
| 2013/0264578 A1* | 10/2013 | Mishra et al. | 257/76 |
| 2013/0292699 A1* | 11/2013 | Ueno et al. | 257/76 |
| 2013/0334538 A1* | 12/2013 | Saunier | 257/76 |
| 2014/0061725 A1* | 3/2014 | Park et al. | 257/194 |
| 2014/0264562 A1* | 9/2014 | Cheng et al. | 257/330 |

FOREIGN PATENT DOCUMENTS

| | | | |
|---|---|---|---|
| JP | 2005-183733 A | 7/2005 | |
| JP | 2009-170546 A | 7/2009 | |
| JP | 2010-105584 A | 5/2010 | |
| JP | 2010-123899 A | 6/2010 | |
| JP | 2010-192633 A | 9/2010 | |
| JP | 2010-267936 A | 11/2010 | |
| JP | 2011-071206 A | 4/2011 | |
| WO | 03/028110 A1 | 4/2003 | |
| WO | 2009/113612 A1 | 9/2009 | |
| WO | WO 2009-113612 A1 * | 9/2009 | H01L 21/338 |
| WO | WO 2010-058561 A1 * | 5/2010 | H01L 21/338 |

OTHER PUBLICATIONS

Written Opinion of the International Searching Authority; PCT/JP2012/068669; Oct. 16, 2012.
An Office Action; "Notice of Reasons for Rejection," issued by the Japanese Patent Office on Sep. 30, 2014, which corresponds to Japanese Patent Application No. 2013-526824 and is related to U.S. Appl. No. 14/162,681; with English language translation.

* cited by examiner

FIELD EFFECT TRANSISTOR

CROSS REFERENCE TO RELATED APPLICATIONS

This application claims benefit of priority to Japanese Patent Application No. 2011-168515 filed Aug. 1, 2011, and to International Patent Application No. PCT/JP2012/068669 filed on Jul. 24, 2012, the entire content of each of which is incorporated herein by reference.

TECHNICAL FIELD

The present technical field relates to a hetero-junction field effect transistor (HFET) for use in power devices and the like.

BACKGROUND

Hitherto, various hetero-junction field effect transistors (HFETs) operated in a normally-off mode have been advised for power device use. FIG. 1 is a cross-sectional side view illustrating the configuration of a conventional HFET 10P disclosed in Japanese Unexamined Patent Application Publication No. 2005-183733.

A buffer layer 30P made of GaN is deposited on a surface of a base substrate 20P made of sapphire or the like. An electron travel layer 40P made of undoped GaN is deposited on a surface of the buffer layer 30P. A barrier layer 50P made of undoped AlGaN is deposited on a surface of the electron travel layer 40P. Undoped GaN in the electron travel layer 40P and undoped AlGaN in the barrier layer 50P form a hetero-junction.

A source electrode 900S and a drain electrode 900D are placed on a surface of the barrier layer 50P so as to be apart from each other at a predetermined distance. A gate electrode 900G is placed on a surface of the barrier layer 50P so as to be located between the source electrode 900S and the drain electrode 900D and is spaced from the source electrode 900S and the drain electrode 900D.

The barrier layer 50P has a thin film region 500P which is thinner than other regions and which is located directly under the gate electrode 900G. The presence of the thin film region 500P realizes a so-called normally-off mode in which no current flows between the source electrode 900S and the drain electrode 900D when no voltage is applied to the gate electrode 900G.

FIG. 2 is a cross-sectional side view illustrating the configuration of a conventional HFET 10Q disclosed in Japanese Unexamined Patent Application Publication No. 2009-170546.

An AlN layer 32Q and a buffer layer 30Q are deposited on a surface of a base substrate 20Q in that order. The buffer layer 30Q is composed of GaN and AlGaN. A channel layer 60Q composed of p-GaN is deposited on a surface of the buffer layer 30Q. The term "p-GaN" refers to p-type doped GaN. An electron travel layer 40Q made of undoped GaN is deposited on a surface of the channel layer 60Q. An n-type doped AlGaN layer 51Q is deposited on a surface of the electron travel layer 40Q. A source electrode 900S and a drain electrode 900D are placed on a surface of the n-type doped AlGaN layer 51Q so as to be apart from each other at a predetermined distance. A gate electrode 900G is placed on a surface of the n-type doped AlGaN layer 51Q so as to be located between the source electrode 900D and the drain electrode 900D and is spaced from the source electrode 900S and the drain electrode 900D. A region located directly under the gate electrode 900G has a hole extending through the n-type doped AlGaN layer 51Q and the electron travel layer 40Q in a stacking direction. An insulating layer 70Q is placed over the wall of the hole and a surface of the n-type doped AlGaN layer 51Q. The gate electrode 900G has a height sufficient to fill the hole covered with the insulating layer 70Q. This allows a recessed structure 700Q in which the n-type doped AlGaN layer 51Q and the electron travel layer 40Q are partitioned to be formed directly under the gate electrode 900G. The presence of the recessed structure 700Q realizes a normally-off mode by making use of depletion due to p-GaN.

SUMMARY

Technical Problem

In the HFET 10P disclosed in Japanese Unexamined Patent Application Publication No. 2005-183733, the threshold voltage Vth depends only on the thickness of the thin film region 500P of the barrier layer 50P. Therefore, if the thickness of the thin film region 500P cannot be controlled with high precision, a desired threshold voltage Vth cannot be obtained. However, it is difficult to stably and accurately fabricate an HFET with a desired threshold voltage Vth because of thickness precision depending on fabrication steps.

Furthermore, in the HFET 10Q disclosed in Japanese Unexamined Patent Application Publication No. 2009-170546, an HFET with a desired threshold voltage Vth can be more stably fabricated as compared to the HFET 10P disclosed in Japanese Unexamined Patent Application Publication No. 2005-183733. However, the channel layer 60Q contains a p-type semiconductor and therefore may possibly have an increased on-resistance.

Accordingly, it is an object of the present disclosure to provide a hetero-junction field effect transistor (HFET) which can stably achieve a positive threshold voltage Vth and which has low on-resistance.

Solution to Problem

A field effect transistor according to the present disclosure includes a lower barrier layer, a channel layer, an upper barrier layer, a source electrode, a drain electrode, a gate electrode, and an insulating layer. The lower barrier layer is placed on a substrate and is made of $Al_xGa_{1-x}N$. The channel layer is placed on a surface of the lower barrier layer that is opposite to the substrate and is made of GaN. The upper barrier layer is placed on a surface of the channel layer that is opposite to the lower barrier layer. The upper barrier layer is made of $Al_yGa_{1-y}N$ having an Al composition proportion exceeding the Al composition proportion of the lower barrier layer. The source electrode and the drain electrode are placed on a surface of the upper barrier layer that is opposite to the channel layer. The insulating layer is placed on a region of the upper barrier layer, the region being in the surface of the upper barrier layer that is provided with the source electrode and the drain electrode, the region excluding a region provided with the source electrode and the drain electrode. The gate electrode is placed on the insulating layer. The field effect transistor has such a configuration and includes a recessed structure which is located directly under the gate electrode and in which the insulating layer extends through the upper barrier layer to the channel layer.

In this configuration, the threshold voltage is higher than 0 V and can be set to 1.0 V (volt) or more due to an AlGaN/GaN/AlGaN three-layer structure consisting of the upper barrier layer, which is made of $Al_yGa_{1-y}N$, the channel layer, which is made of GaN, and the lower barrier layer, which is made of $Al_xGa_{1-x}N$, and the recessed structure, which is located directly under the gate electrode and in which the insulating layer extends through the upper barrier layer to the channel layer.

In the field effect transistor according to the present disclosure, at least one portion of GaN making up the channel layer is preferably negatively doped.

In this configuration, the electrical conductivity during an on-period can be further increased. That is, the drain current during an on-period can be increased. In addition, the field effect transistor can be more readily fabricated than Example 2 disclosed in Japanese Unexamined Patent Application Publication No. 2009-170546 because GaN is more likely to become negative than positive due to the self-compensation effect of a wide-gap semiconductor.

In the field effect transistor according to the present disclosure, the channel layer preferably includes a plurality of GaN sub-layers. In this configuration, a detailed configuration example of the channel layer is shown.

In the field effect transistor according to the present disclosure, a channel layer includes a first channel sub-layer located on the upper barrier layer side and a second channel sub-layer located on the lower barrier layer. The n-type doping concentration of the first channel sub-layer is less than the n-type doping concentration of the second channel sub-layer. The insulating layer is placed so as not to reach the second channel sub-layer.

In this configuration, the channel layer includes the first channel sub-layer and the second channel sub-layer, which are different in n-type doping concentration from each other. A structure in which the insulating layer extends only into the first channel sub-layer, which has a relatively low n-type doping concentration, is realized in the channel layer, whereby the threshold voltage is likely to be stable regardless of the depth of the recessed structure.

In the field effect transistor according to the present disclosure, the first channel sub-layer is made of undoped GaN. The second channel sub-layer is made of negatively doped GaN.

In this configuration, the insulating layer extends only into the first channel sub-layer. In the first channel sub-layer, which is made of undoped GaN, the threshold voltage is substantially constant and is stable regardless of the depth of the insulating layer. Thus, a desired threshold voltage can be accurately and reliably achieved regardless of the accuracy of forming the recessed structure in fabrication steps. That is, the field effect transistor can be stably fabricated so as to have a desired threshold voltage.

Advantageous Effects of Disclosure

According to the present disclosure, a hetero-junction field effect transistor (HFET) having a positive threshold voltage and low on-resistance can be stably provided.

DETAILED DESCRIPTION

Figure 1:
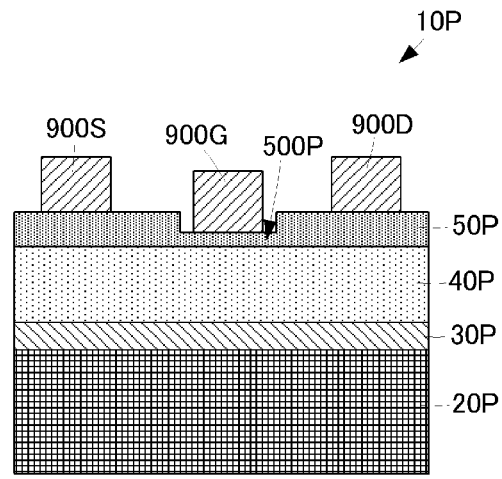
FIG. 1 is a cross-sectional side view illustrating the configuration of a conventional HFET 10P disclosed in Japanese Unexamined Patent Application Publication No. 2005-183733.
Figure 2:
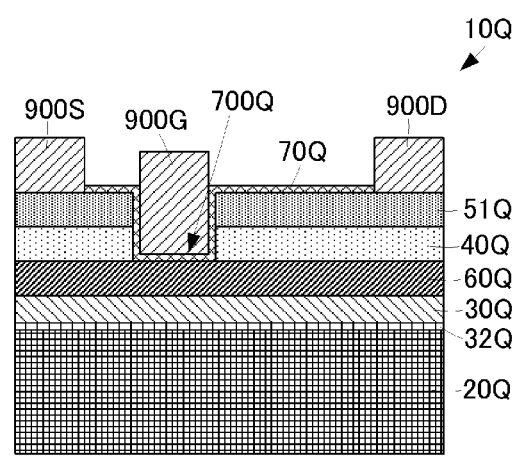
FIG. 2 is a cross-sectional side view illustrating the configuration of a conventional HFET 10Q disclosed in Japanese Unexamined Patent Application Publication No. 2009-170546.
Figure 3:
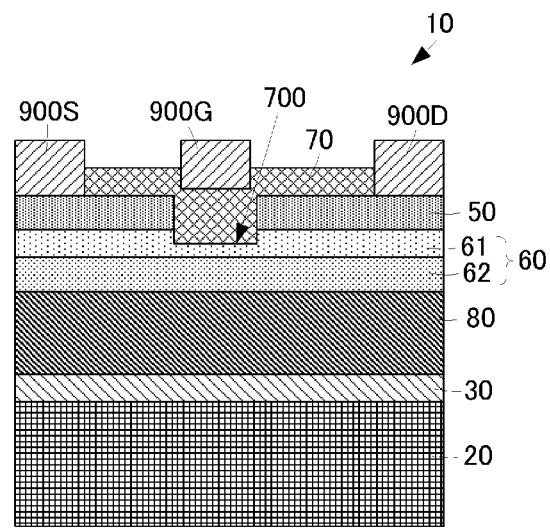
FIG. 3 is a cross-sectional side view of a HFET 10.
Figure 4:
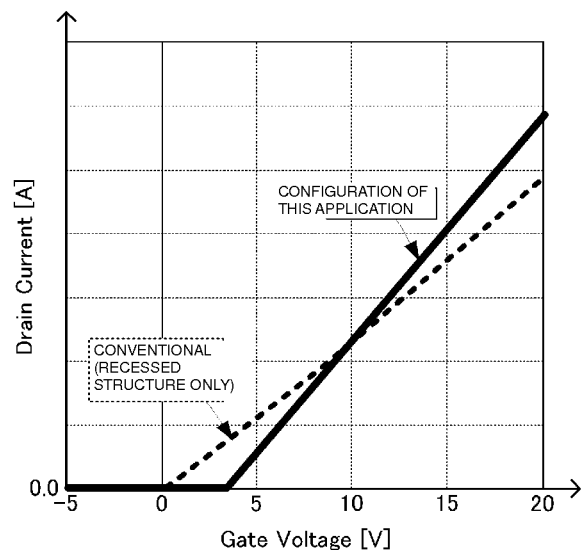
FIG. 4 shows gate voltage-drain current characteristics of the HFET 10.

Hetero-junction field effect transistors according to embodiments of the present disclosure will now be described with reference to the accompanying drawings. A hetero-junction field effect transistor is hereinafter referred to as "HFET". FIG. 3 is a cross-sectional side view of a HFET 10 according to an embodiment of the present disclosure. FIG. 4 shows gate voltage-drain current characteristics of the HFET 10 according to this embodiment and those of a conventional HFET (a recessed structure only).

The HFET 10 includes a base substrate 20. The base substrate 20 is made of Si. The thickness of the base substrate 20 may be appropriately set depending on the height of the HFET 10 or the like.

A lattice relaxation layer 30 is placed on the upper surface of the base substrate 20. The lattice relaxation layer 30 is a layer for reducing the lattice mismatch between the base substrate 20, which is made of Si, and a lower barrier layer 80 which is made of $Al_xGa_{1-x}N$ as described below and may have a composition capable of reducing the lattice mismatch therebetween. The thickness of the lattice relaxation layer 30 may also be appropriately set depending on the height of the HFET 10 or the like.

The lower barrier layer 80 is placed on the upper surface of the lattice relaxation layer 30. The upper surface of the lattice relaxation layer 30 is opposite to a surface of the lattice relaxation layer 30 that is provided with the base substrate 20. The lower barrier layer 80 is made of $Al_xGa_{1-x}N$. Herein, the composition proportions of Al and Ga are determined such that x satisfies the condition ($0<x\leq0.20$). The thickness of the lower barrier layer 80 is a predetermined value of 500 nm or more.

A channel layer 60 is placed on the upper surface of the lower barrier layer 80. The upper surface of the lower barrier layer 80 is opposite to a surface of the lower barrier layer 80 that is provided with the lattice relaxation layer 30.

The channel layer 60 has a two-layer structure consisting of a first channel sub-layer 61 and a second channel sub-layer 62. The second channel sub-layer 62 abuts the lower barrier layer 80. The channel layer 60 is made of GaN. In particular, the first channel sub-layer 61 is made of undoped GaN, which is undoped with another element, and the second channel sub-layer 62 is made of n-type doped GaN doped with Si. An element used for doping is not limited to Si and may be an element (for example, Ge or O) capable of rendering GaN negative by doping. The channel layer is not limited to two layers and may further include a layer having a different n-type doping concentration.

The thickness of the second channel sub-layer 62 is appropriately set depending on the desired threshold voltage Vth and the drain current Id, though the detailed concept of setting the thickness is described below. The thickness of the first channel sub-layer 61 is appropriately set depending on the accuracy of forming a recessed portion directly under a gate electrode 900G when a recessed structure 700 is formed. In particular, the thickness is set such that the variation in depth of the recessed portion can be sufficiently covered when the recessed portion for the recessed structure is formed.

An upper barrier layer 50 is placed on the upper surface of the channel layer 60. The upper surface of the channel layer 60 is opposite to a surface of the channel layer 60 that is provided with the lower barrier layer 80. In other words, the upper surface of the channel layer 60 is a surface of the first channel sub-layer 61 that is opposite to the second channel sub-layer 62.

The upper barrier layer 50 is made of $Al_yGa_{1-y}N$. Herein, the composition proportions of Al and Ga are determined such that y satisfies the condition (0.15≤y23 0.30). The thickness of the upper barrier layer 50 is a predetermined value of 10 nm to 30 nm. The Al content of the upper barrier layer 50 is set to be higher than the Al content of the lower barrier layer 80.

A drain electrode 900D and a source electrode 900S are placed on the upper surface of the upper barrier layer 50 in such a state that the drain electrode 900D and the source electrode 900S are apart from each other at a predetermined distance. The upper surface of the upper barrier layer 50 is opposite to a surface of the upper barrier layer 50 that is provided with the channel layer 60. An insulating layer 70 is placed on the upper surface of the upper barrier layer 50 so as to be located between the drain electrode 900D and the source electrode 900S. The insulating layer 70 is made of silicon nitride (SiN), silicon dioxide ($SiO_2$), aluminum oxide ($Al_2O_3$), or the like. The gate electrode 900G is placed in a predetermined position in the insulating layer 70 so as to extend downward from the upper surface of the insulating layer 70 by a predetermined length and so as to protrude from the upper surface thereof by a predetermined length. The upper surface of the insulating layer 70 is a surface of the insulating layer 70 that is opposite to the upper barrier layer 50. The gate electrode 900G is placed between the drain electrode 900D and the source electrode 900S so as to be apart from the drain electrode 900D and the source electrode 9005. The gate electrode 900G is formed by depositing an electrode of Au or the like on a base made of Ni. The drain electrode 900D and the source electrode 900S are each formed by depositing an electrode of Au or the like on a base metal such as Ti or Al.

When the HFET 10 is viewed from above, the recessed portion is located in a region with a predetermined range covering underneath the gate electrode 900G. The recessed portion extends through the upper barrier layer 50 to a heightwise intermediate portion of the first channel sub-layer 61. The insulating layer 70 is formed so as to have a shape extending to the recessed portion. This configuration allows the recessed structure 700 to be realized directly under the gate electrode 900G. The bottom of the recessed structure 700 (the bottom of the recessed portion) may be within the heightwise range of the first channel sub-layer 61 so as not to reach the second channel sub-layer 62.

Since the recessed structure 700 is present, a two-dimensional electron gas (not shown) formed at the boundary of a hetero-junction between the upper barrier layer 50 and the channel layer 60 is blocked directly under the gate electrode 900G. This allows the threshold voltage Vth of the HFET 10, as well as characteristics of the conventional configuration shown in FIG. 4, to be substantially 0 [V].

Furthermore, in this embodiment, the following structure is used: a structure in which the channel layer 60, which is made of GaN, is sandwiched between the upper barrier layer 50, which is made of $Al_yGa_{1-y}N$ (0.15≤y≤0.30), and the lower barrier layer 80, which is made of $Al_xGa_{1-x}N$ (0<x≤0.20, where x<y). That is, the upper barrier layer 50, in which the composition proportion of Al is relatively high, is placed closer to an electrode than the channel layer 60 and the lower barrier layer 80, in which the composition proportion of Al is relatively low, is placed opposite to the upper barrier layer 50 with the channel layer 60 therebetween.

This structure allows the threshold voltage Vth to be raised to a positive value, about several V, as shown in FIG. 4. This enables an HFET having a positive threshold voltage Vth to be reliably achieved.

Furthermore, in this embodiment, the second channel sub-layer 62 of the channel layer 60 is negatively doped and therefore the number of electrons traveling in the channel layer can be increased as compared to the case of undoping or positive doping. This allows the HFET 10 of this embodiment to have a reduced on-resistance and an increased drain current as shown in FIG. 4.

Figure 5:
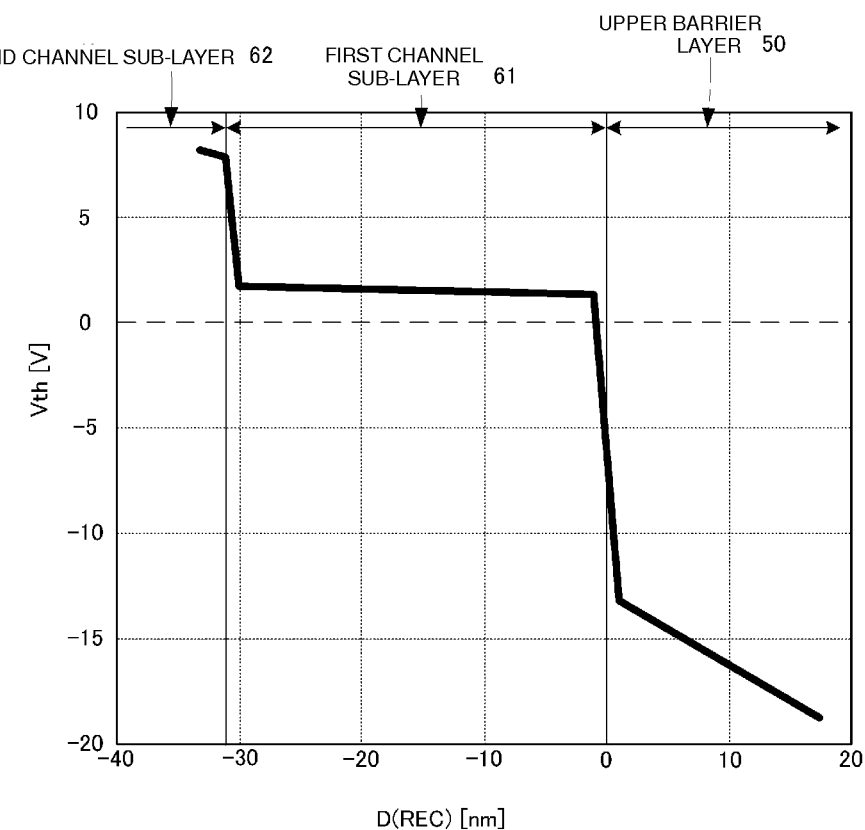
FIG. 5 is a graph showing the relationship between the depth of a recessed structure 700 and the threshold voltage Vth.

Furthermore, in this embodiment, the channel layer 60 is composed of a laminate including the first channel sub-layer 61, which is undoped, and the second channel sub-layer 62, which is negatively doped, and the recessed structure 700 extends to the first channel sub-layer 61; hence, a change in threshold voltage Vth due to the depth of the recessed structure 700 can be suppressed as shown in FIG. 5.

FIG. 5 is a graph showing the relationship between the depth of the recessed structure 700 and the threshold voltage Vth. FIG. 5 shows the case where the Al concentration of the lower barrier layer 80 is 8%, the carrier concentration of the second channel sub-layer 62 is $1.0 \times 10^{18}$ $cm^{-3}$, and the thickness of the second channel sub-layer 62 is 15 nm. In FIG. 5, D(REC)=0 when the bottom of the recessed structure 700 is located at the boundary between the first channel sub-layer 61 and the upper barrier layer 50 and D(REC) is set such that as D(REC) is shallower or deeper, a positive value or a negative value, respectively, is obtained.

As is clear from FIG. 5, when the depth (bottom position) of the recessed structure 700 is within the height range of the first channel sub-layer 61, the threshold voltage Vth is about 1 V and is constant. Characteristics under a single condition are shown in FIG. 5. The inventors have experimentally confirmed that characteristics of the threshold voltage Vth shift in parallel in such a direction that the threshold voltage Vth increases or decreases. That is, the threshold voltage Vth is constant when the depth (bottom position) of the recessed structure 700 is within the height range of the first channel sub-layer 61 like the configuration of this embodiment.

As described above, the use of the configuration of this embodiment allows the variation of the threshold voltage Vth due to the variation in depth of the recessed structure 700 to be suppressed. This enables HFETs with stable characteristics to be continuously fabricated without being affected by the depthwise accuracy of forming the recessed structure 700 in steps of fabricating the HFETs.

In the HFET 10, which has such a configuration, the threshold voltage Vth and the drain current can be adjusted by adjusting the thickness D (nGaN) and carrier concentration n (nGaN) of the second channel sub-layer 62.

Figure 6A:
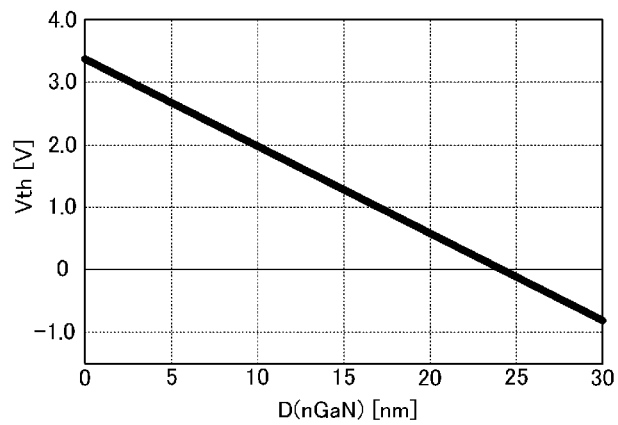
FIGS. 6A and 6B include graphs showing the changes of the threshold voltage Vth and drain current due to the change in thickness D (nGaN) of a second channel sub-layer 62.
Figure 6B:
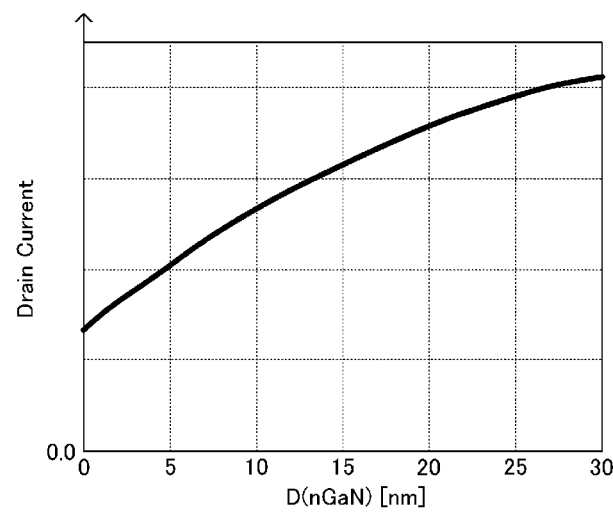

FIG. 6(A) is a graph showing the change of the threshold voltage Vth due to the change in thickness D (nGaN) of the second channel sub-layer 62. FIG. 6(B) is a graph showing the change of the drain current due to the change in thickness D (nGaN) of the second channel sub-layer 62. FIG. 6 shows the case where the Al concentration of the lower barrier layer 80 is 8% and the carrier concentration n (nGaN) of the second channel sub-layer 62 is $1.0 \times 10^{18}$ cm$^{-3}$ As shown in FIG. 6(A), the threshold voltage Vth can be reduced by increasing the thickness D (nGaN) of the second channel sub-layer 62. In this case, the threshold voltage Vth is 0.0 V when the thickness is about 24 nm. Therefore, in order to adjust the threshold voltage Vth to a positive value, the thickness may be adjusted to 20 nm or less in consideration of variations in fabrication steps. The thickness D (nGaN) is more preferably about 15 nm to 20 nm in order to adjust the threshold voltage Vth to about 1.0 V. Such a thickness enables the drain current to be increased as shown in FIG. 6(B).

Figure 7A:
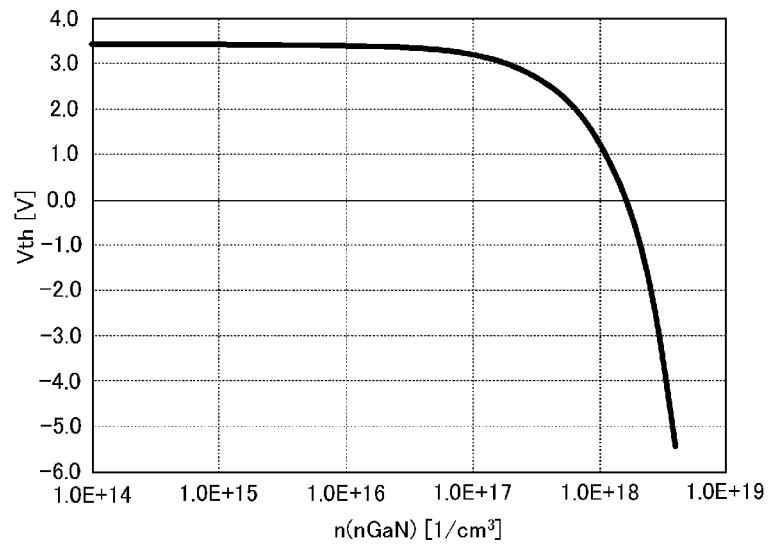
FIGS. 7A and 7B include graphs showing the changes of the threshold voltage Vth and drain current due to the change in carrier concentration n (nGaN) of the second channel sub-layer 62.
Figure 7B:
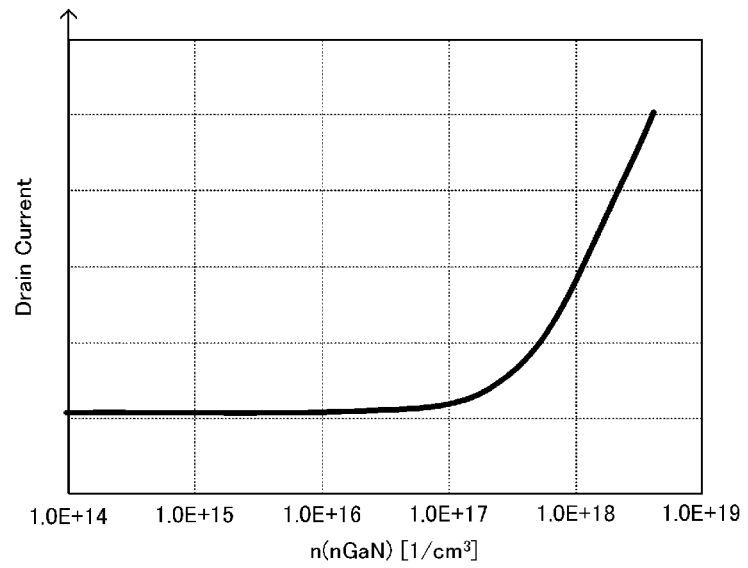

FIG. 7(A) is a graph showing the change of the threshold voltage Vth due to the change in carrier concentration n (nGaN) of the second channel sub-layer 62. FIG. 7(B) is a graph showing the change of the drain current due to the change in carrier concentration n (nGaN) of the second channel sub-layer 62. FIG. 7 shows the case where the Al concentration of the lower barrier layer 80 is 8% and the thickness D (nGaN) of the second channel sub-layer 62 is 15 nm.

As shown in FIG. 7(A), when the carrier concentration n (nGaN) $1.0 \times 10^{17}$ cm$^{-3}$ or less, the threshold voltage Vth does not vary even though the carrier concentration n (nGaN) of the second channel sub-layer 62 is increased. However, when the concentration is not less than this value, the threshold voltage Vth drops sharply to 0 V or less. As shown in FIG. 7(B), when the carrier concentration n (nGaN) is $1.0 \times 10^{17}$ cm$^{-3}$ or less, the drain current does not vary. However, when the carrier concentration is not less than this value, the drain current rises sharply. Thus, in order to achieve a high drain current, in a zone where the drain current rises sharply, the carrier concentration n (nGaN) is preferably selected such that the threshold voltage Vth is higher than 0 V. From this viewpoint, the carrier concentration n (nGaN) is preferably about $1.0 \times 10^{18}$ cm$^{-3}$.

FIGS. 6 and 7 show the case where the carrier concentration n (nGaN) of the second channel sub-layer 62 is maintained at $1.0 \times 10^{18}$ cm$^{-3}$ and the thickness D (nGaN) is varied and the case where the thickness D (nGaN) is maintained at 15 nm and the carrier concentration n (nGaN) is varied. The inventors have confirmed that similar characteristics are obtained even though the thickness D (nGaN) and the carrier concentration n (nGaN) are each set to another value.

The HFET 10 can be readily achieved so as to have a predetermined positive threshold voltage Vth and low on-resistance in such a way that the carrier concentration n (nGaN) and thickness D (nGaN) of the second channel sub-layer 62, which is negatively doped, are appropriately set as described above.

In the above description, the first channel sub-layer is undoped. When the first channel sub-layer 61 is significantly lower in carrier concentration than the second channel sub-layer 62, the above action and effect can be obtained even though the first channel sub-layer 61 is negatively doped.

Figure 8:
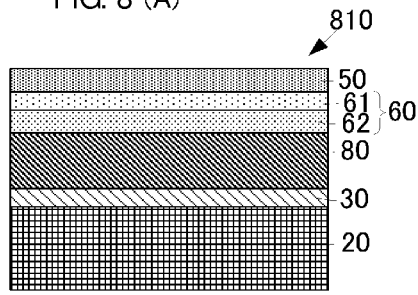
FIGS. 8A through 8G include schematic sectional views illustrating structures processed in steps of fabricating an HFET 10.
Figure 8:
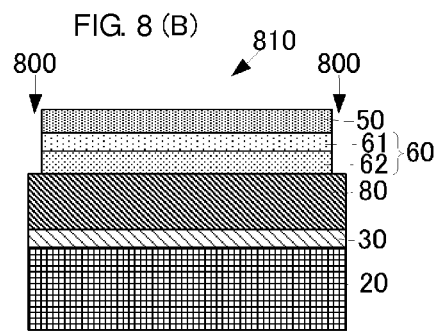
Figure 8:
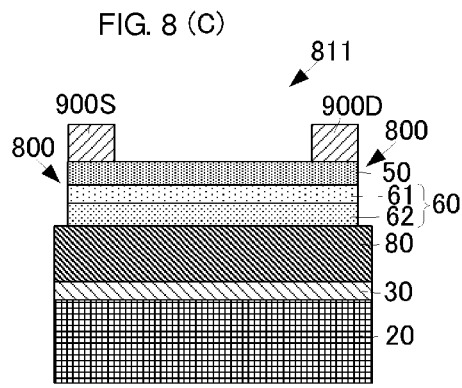
Figure 8:
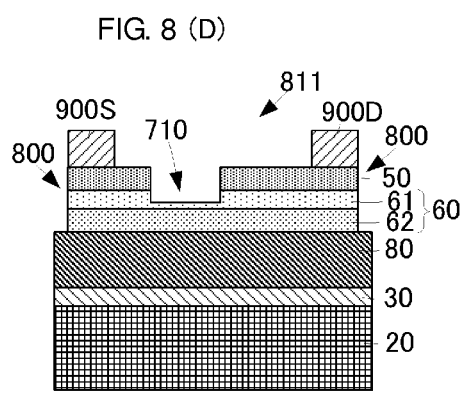
Figure 8:
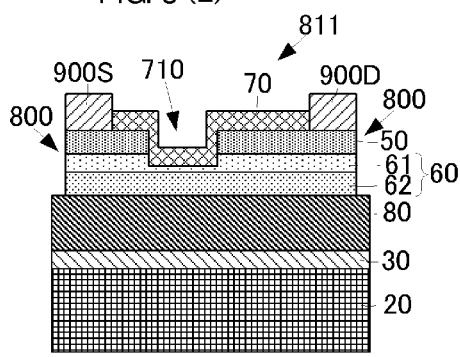
Figure 8:
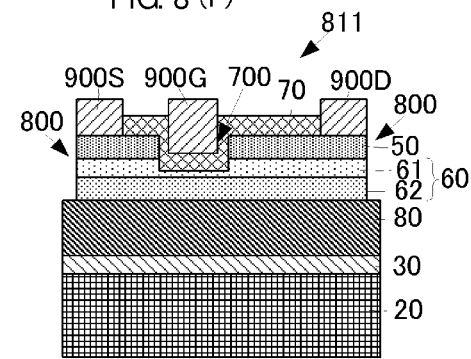
Figure 8:
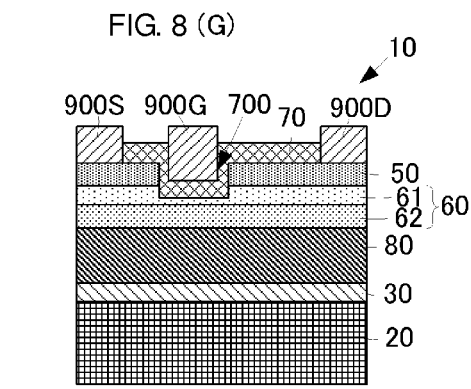

By the way, the HFET 10, which has the above configuration, is fabricated through a fabrication flow described below. FIG. 8 includes schematic sectional views illustrating structures processed in steps of fabricating the HFET 10 according to this embodiment.

Formation treatments below are performed in such a state that a predetermined number of HFETs 10 are arranged on a principal surface of a mother wafer. After all treatments below are finished, the HFETs 10 are separated.

First, the base substrate 20, which is made of Si, is prepared. Next, as shown in FIG. 8(A), a buffer layer 30, the lower barrier layer 80, the second channel sub-layer 62, the first channel sub-layer 61, and the upper barrier layer 50 are formed on a principal surface of the base substrate 20 in that order in such a way that these layers are epitaxially grown by metal-organic chemical vapor deposition (MOCVD). This allows a composite semiconductor substrate 810 to be formed. Herein, the thickness of each layer of the composite semiconductor substrate 810 is appropriately set depending on functions and specifications of layers of the HFET 10 as described above. The buffer layer 30 may be formed at low temperature using GaN, AlN, or the like.

Next, as shown in FIG. 8(B), the composite semiconductor substrate 810 is selectively dry-etched, whereby element isolation grooves 800 for cutting the HFETs 10 out of the mother wafer are formed. The depth of each element isolation groove 800 ranges to the channel layer 60 as shown in FIG. 8(B), is not limited to this level, and may be appropriately set depending on fabrication conditions or the like.

Next, as shown in FIG. 8(C), the source electrode 900S and the drain electrode 900D are formed on a surface of the upper barrier layer 50 in the composite semiconductor substrate 810 so as to be apart from each other at a predetermined distance. The source electrode 900S and the drain electrode 900D are formed by depositing Au on a base metal such as Ti or Al as described above. This allows a source/drain-bearing composite semiconductor substrate 811 to be formed.

Next, the source/drain-bearing composite semiconductor substrate 811 is annealed, whereby the source electrode 900S and the drain electrode 900D are reduced in contact resistance.

Next, as shown in FIG. 8(D), a predetermined region of the source/drain-bearing composite semiconductor substrate 811 that is located between the source electrode 900S and the drain electrode 900D, that is, a region for forming the gate electrode 900G in a subsequent step is selectively dry-etched, whereby a recessed portion 710 is formed. The recessed portion 710 is formed at a depth so as to extend through the upper barrier layer 50 and so as not to reach an inner portion of the second channel sub-layer 62, that is, the recessed portion 710 is formed at a depth such that the bottom of the recessed portion is located in the first channel sub-layer 61.

Next, as shown in FIG. 8(E), the insulating layer 70 is formed on a surface of the upper barrier layer 50 that includes a region of the source/drain-bearing composite semiconductor substrate 811 that is provided with the recessed portion 710. The thickness of the insulating layer 70 is appropriately set depending on functions and specifications.

Next, as shown in FIG. 8(F), the gate electrode 900G is formed on the region provided with the recessed portion 710 in a surface of the insulating layer 70. The gate electrode 900G is formed by depositing Au or the like on a base metal such as Ni.

The mother wafer overlaid with the HFETs 10 is divided along the element isolation grooves 800, whereby the HFETs 10 are separated as shown in FIG. 8(G). This allows the HFETs 10 to be obtained from the single mother wafer at the same time.

The invention claimed is:
1. A field effect transistor comprising:
a lower barrier layer which is placed on a substrate and which is made of Al$_x$Ga$_{1-x}$N;
a channel layer which is placed on a surface of the lower barrier layer that is opposite to the substrate and which is made of GaN;
an upper barrier layer which is placed on a surface of the channel layer that is opposite to the lower barrier layer and which is made of $Al_yGa_{1-y}N$ having an Al composition proportion exceeding an Al composition proportion of the lower barrier layer;

a source electrode and drain electrode which are placed on a surface of the upper barrier layer that is opposite to the channel layer;

an insulating layer placed on a region of the upper barrier layer, the region being in a surface of the upper barrier layer that is provided with the source electrode and the drain electrode, the region excluding a region provided with the source electrode and the drain electrode;

a gate electrode placed on the insulating layer; and a region directly under the gate electrode having a recessed structure in which the insulating layer extends through the upper barrier layer and partly into the channel layer; wherein the channel layer includes a first channel sub-layer located on the upper barrier layer side and a second channel sub-layer located on the lower barrier layer side, the n-type doping concentration of the first channel sub-layer is less than the n-type doping concentration of the second channel sub-layer, and the insulating layer is placed so as not to reach the second channel sub-layer.

2. The field effect transistor according to claim 1, wherein the first channel sub-layer is made of undoped GaN and the second channel sub-layer is made of negatively doped GaN.

3. The field effect transistor according to claim 1, wherein the channel layer includes a plurality of GaN sub-layers.

4. The field effect transistor according to claim 1, wherein the channel layer includes a first GaN sub-layer and a second GaN sub-layer with the GaN sub-layer contacting the lower barrier layer and the second GaN sub-layer contacting the upper barrier layer.

5. The field effect transistor according to claim 4, wherein the recessed structure with insulating layer extends into the first GaN sub-layer but does not make contact with the second GaN sub-layer.

* * * * *